US010446595B2

(12) United States Patent
Miyoshi et al.

(10) Patent No.: US 10,446,595 B2
(45) Date of Patent: Oct. 15, 2019

(54) SOLID-STATE IMAGING DEVICE

(71) Applicant: RICOH COMPANY, LTD., Tokyo (JP)

(72) Inventors: Yuuya Miyoshi, Osaka (JP); Tohru Kanno, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/158,780

(22) Filed: May 19, 2016

(65) Prior Publication Data
US 2016/0358958 A1 Dec. 8, 2016

(30) Foreign Application Priority Data

Jun. 8, 2015 (JP) .................................. 2015-115987

(51) Int. Cl.
*H04N 5/335* (2011.01)
*H01L 27/146* (2006.01)
*H04N 5/3745* (2011.01)
*H04N 9/04* (2006.01)
*H04N 5/369* (2011.01)

(52) U.S. Cl.
CPC .. *H01L 27/14612* (2013.01); *H01L 27/14621* (2013.01); *H01L 27/14627* (2013.01); *H04N 5/3692* (2013.01); *H04N 5/3745* (2013.01); *H04N 5/37452* (2013.01); *H04N 9/045* (2013.01)

(58) Field of Classification Search
CPC .............................. H04N 5/3692; H04N 5/335
USPC ........................................................ 348/294
See application file for complete search history.

(56) References Cited

U.S. PATENT DOCUMENTS 5,355,164 A * 10/1994 Shimoyama ........... H04N 5/361
                                                          348/243
7,528,878 B2 * 5/2009 Sato ....................... H04N 5/343
                                                          348/294
(Continued)

FOREIGN PATENT DOCUMENTS

CN      101610419 A     12/2009
CN      101841666 A      9/2010
(Continued)

OTHER PUBLICATIONS

European search report dated Jul. 25, 2016 in corresponding European Patent Application No. 16170719.5.
(Continued)

*Primary Examiner* — Anthony J Daniels
(74) *Attorney, Agent, or Firm* — Xsensus, LLP

(57) ABSTRACT

A solid-state imaging device includes a photoelectric converter including a plurality of light receiving elements arranged along one direction in correspondence with each color of received light, each light receiving element generating an electric charge corresponding to an amount of received light, an electric charge storage unit including a plurality of capacitors storing the electric charges generated by the respective light receiving elements, and a signal processing unit configured to process each of the electric charges stored by the plurality of capacitors as a signal. The electric charge storage unit is disposed so as to oppose the signal processing unit across the photoelectric converter.

18 Claims, 11 Drawing Sheets

(56) References Cited

U.S. PATENT DOCUMENTS

| | | | |
|---|---|---|---|
| 8,598,506 B2* | 12/2013 | Kato | H04N 5/3745 250/214 A |
| 2001/0008268 A1* | 7/2001 | Funakoshi | H04N 5/3658 250/208.1 |
| 2003/0206236 A1* | 11/2003 | Levantovsky | H04N 3/155 348/310 |
| 2005/0040485 A1 | 2/2005 | Kawahito | |
| 2008/0068471 A1 | 3/2008 | Kondo et al. | |
| 2009/0310001 A1 | 12/2009 | Masuyama et al. | |
| 2010/0085457 A1* | 4/2010 | Yamashita | H01L 27/14625 348/308 |
| 2010/0231761 A1* | 9/2010 | Yanai | H01L 27/14603 348/243 |
| 2012/0113486 A1* | 5/2012 | Masuda | H04N 1/1912 358/482 |
| 2012/0286138 A1* | 11/2012 | Yamazaki | H04N 5/378 250/208.1 |
| 2013/0162870 A1 | 6/2013 | Miyoshi et al. | |
| 2014/0078360 A1* | 3/2014 | Park | H04N 5/355 348/294 |
| 2014/0118572 A1* | 5/2014 | Kuang | H04N 9/045 348/222.1 |
| 2015/0304578 A1* | 10/2015 | Okura | H04N 5/374 348/308 |

FOREIGN PATENT DOCUMENTS

| | | |
|---|---|---|
| CN | 102164252 A | 8/2011 |
| CN | 102651803 A | 8/2012 |
| JP | 2000-184282 | 6/2000 |
| JP | 2008-72188 | 3/2008 |
| JP | 2008-193527 | 8/2008 |
| JP | 4288346 | 4/2009 |
| JP | 2010-161484 | 7/2010 |
| JP | 2011-82819 | 4/2011 |
| JP | 2011-155306 | 8/2011 |
| JP | 4846076 | 10/2011 |
| JP | 2012-65106 | 3/2012 |
| JP | 4957925 | 3/2012 |
| JP | 2013-9301 | 1/2013 |
| JP | 2013-90304 | 5/2013 |
| WO | 2011/155442 A1 | 12/2011 |

OTHER PUBLICATIONS

Nov. 6, 2018 Chinese official action (and English translation thereof) in connection with corresponding Chines patent application No. 201610397519.7.

Nov. 30, 2018 Japanese official action in connection with corresponding Japanese patent application No. 2015-115987.

* cited by examiner

US 10,446,595 B2

SOLID-STATE IMAGING DEVICE

CROSS-REFERENCE TO RELATED APPLICATION

The present application claims priority under 35 U.S.C. § 119 to Japanese Patent Application No. 2015-115987, filed Jun. 8, 2015. The contents of which are incorporated herein by reference in their entirety.

BACKGROUND OF THE INVENTION

1. Field of the Invention

The present invention relates to imaging devices, and in particular, relates to a solid-state imaging device.

2. Description of the Related Art

Solid-state imaging devices each including on-chip micro-lenses and color filters are used in various types of imaging devices such as video cameras, digital cameras, copiers, and the like.

Further, International Patent Publication No. WO/2011/155442 discloses an amplification-type solid-state imaging device that includes a pixel array in which a plurality of pixels each including a plurality of capacitors are arranged in a matrix formation and a controlling circuit that controls operations of the pixels included in the pixel array.

In conventional examples, however, when electrode pads are provided above and below a pixel region of a wafer, unevenness may occur in the application of color filter pigments and/or in the formation of the micro-lenses. Further, when the distance from the edge of a chip to each of the pixels is too short, the pixels may be influenced by stress, and the image characteristics may be degraded. Furthermore, when each of the pixels includes an analog memory and a second amplifying transistor (SF2), a problem arises where the resolution varies when the pixel size is changed because the distances between photo diodes (PDs) change.

SUMMARY OF THE INVENTION

According to one aspect of the present invention, a solid-state imaging device includes a photoelectric converter including a plurality of light receiving elements arranged along one direction in correspondence with each color of received light, each light receiving element generating an electric charge corresponding to an amount of received light, an electric charge storage unit including a plurality of capacitors storing the electric charges generated by the respective light receiving elements, and a signal processing unit configured to process each of the electric charges stored by the plurality of capacitors as a signal. The electric charge storage unit is disposed so as to oppose the signal processing unit across the photoelectric converter.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENTS

Figure 1:
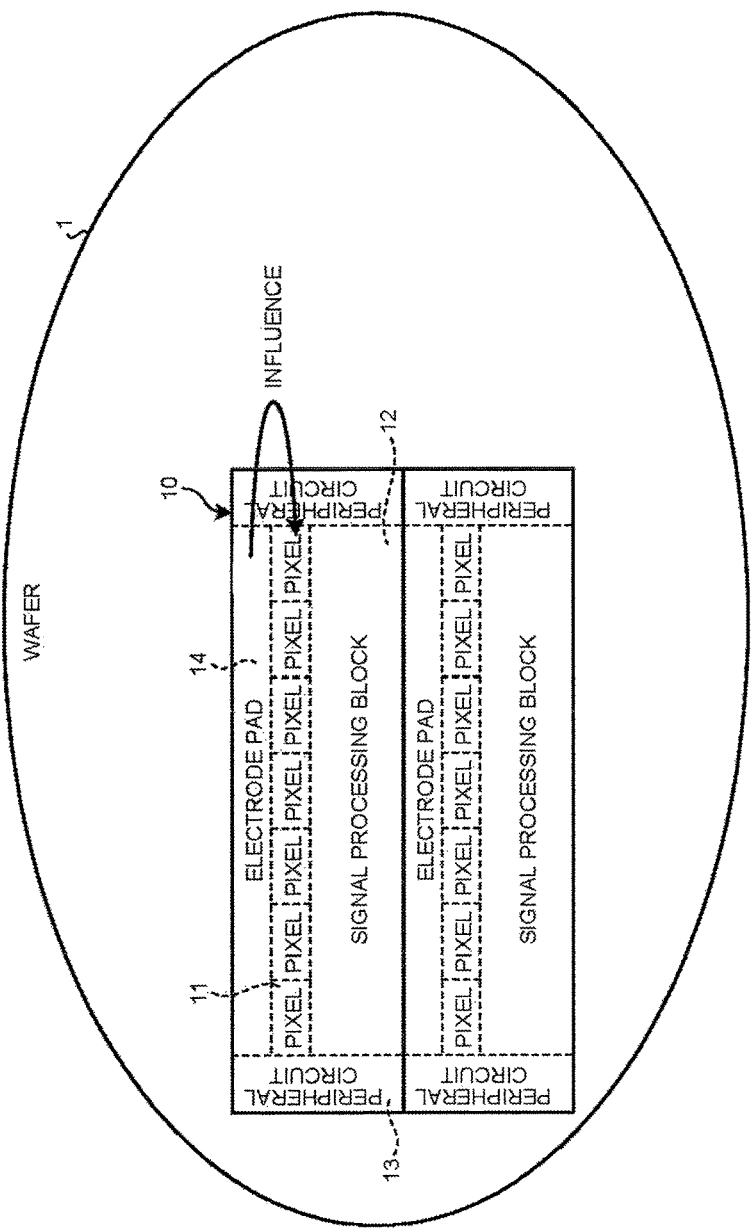
FIG. 1 is a diagram of a first example state in which a solid-state imaging device is formed on a wafer.

The terminology used herein is for the purpose of describing particular embodiments only and is not intended to be limiting of the present invention. As used herein, the singular forms "a", "an" and "the" are intended to include the plural forms as well, unless the context clearly indicates otherwise. In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result. An embodiment of the present invention will be described in detail below with reference to the drawings.

First, a background of the present invention will be explained. FIG. 1 is a schematic diagram of a first example state in which a solid-state imaging device (a Complementary Metal-Oxide Semiconductor [CMOS] linear image sensor) 10 is formed on a wafer 1. The solid-state imaging device 10 is a chip including a plurality of pixels 11, signal processing blocks 12, peripheral circuits 13, and electrode pads 14.

The plurality of pixels 11 are arranged along one direction and are each configured to perform a photoelectric conversion to generate an electric charge according to the amount of received light. Each of the signal processing blocks 12 performs a process such as a Correlative Double Sampling (CDS) process, for example, by using the electric charges generated by the pixels 11 as image signals. Each of the peripheral circuits 13 includes a circuit that, for example, outputs the signals processed by a corresponding one of the signal processing blocks 12. Each of the electrode pads 14 is a region including, for example, a power source terminal and a terminal that outputs the image signals from corresponding ones of the peripheral circuits 13 to the outside.

As illustrated in FIG. 1, the solid-state imaging device 10 has a longitudinal shape along one direction. When the electrode pads 14 are provided so as to be positioned adjacent to the pixels 11 arranged in rows, the pixels 11 may be influenced (e. g., the unevenness in the formation and the stress) as described above by the electrode pads 14 provided in the chip.

Figure 2:
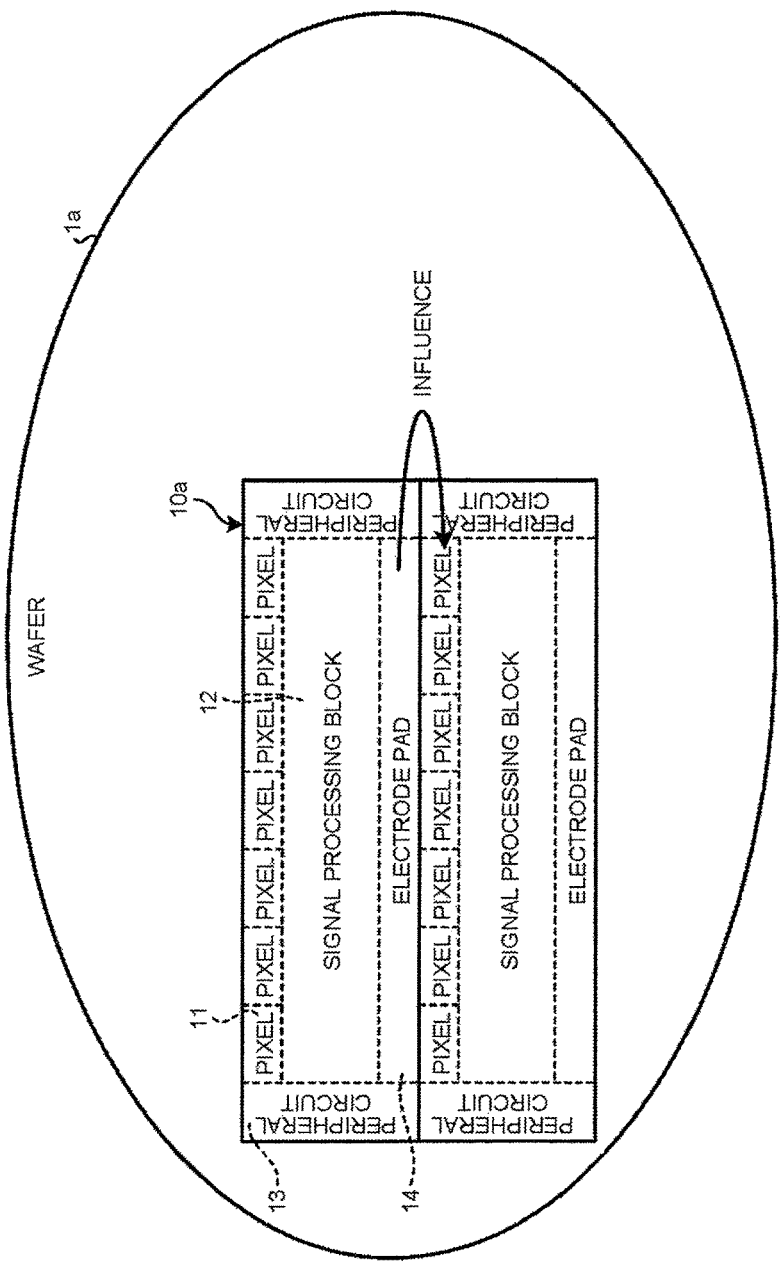
FIG. 2 is a diagram of a second example state in which a solid-state imaging device is formed on a wafer.

FIG. 2 is a schematic diagram of a second example state in which a solid-state imaging device (a CMOS linear image sensor) 10a is formed on a wafer 1a. The solid-state imaging device 10a is a chip in which the plurality of pixels 11, the signal processing blocks 12, the peripheral circuits 13, and the electrode pads 14 are provided with a positional arrangement different from that of the solid-state imaging device 10. Hereinafter, some of the constituent elements that are substantially the same will be referred to by using the same reference characters.

As illustrated in FIG. 2, in the solid-state imaging device 10a, the pixels 11 may be influenced (e. g., the unevenness in the formation and the stress) as described above by the electrode pad 14 provided in the other chip positioned adjacent to the pixels 11 arranged in a row.

Figure 3:
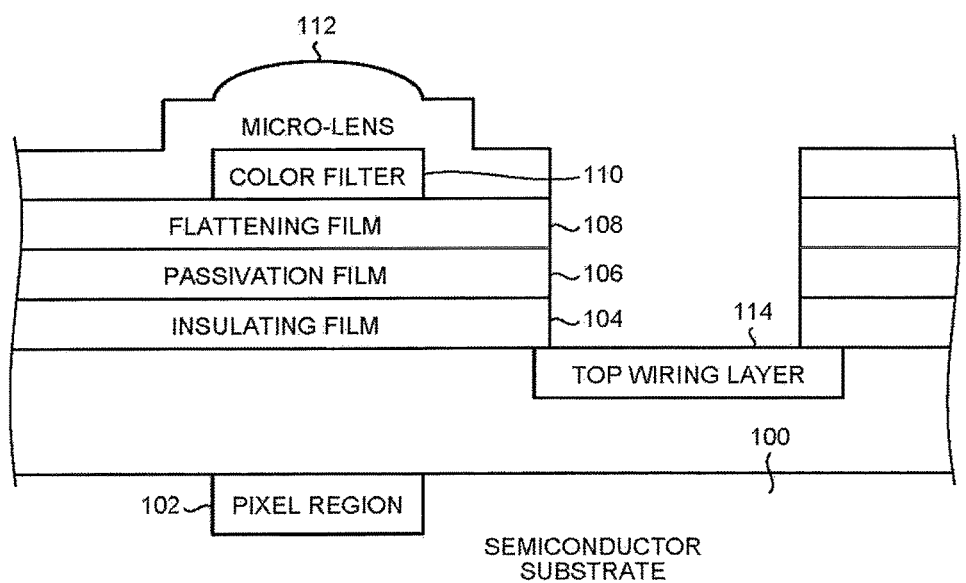
FIG. 3 is a drawing of an example of a cross-section of the solid-state imaging device.

Next, the abovementioned influence on the pixels will be explained further in detail. FIG. 3 is a drawing of an example of a cross-section of the solid-state imaging device 10. The solid-state imaging device 10 is configured so that an insulating film 104, a passivation film 106, a flattening film 108, a color filter 110, and a micro-lens 112 are laminated over a pixel region 102 formed in a semiconductor substrate 100. Further, a top wiring layer 114 is provided so as to be positioned adjacent to the pixel region 102. The top wiring layer 114 is the electrode pad 14.

After a pad opening is formed, a resin material or the like is applied to the solid-state imaging device 10 through a spin coating process, in order to form the color filter 110 and the micro-lens 112 which is of an on-chip type. In that situation, because the solid-state imaging device 10 has steps formed at the pad opening, unevenness occurs originating from the steps. The closer an uneven section is positioned to the pad opening, the higher the degree of unevenness is. In other words, when the distance between the color filter 110 and the micro-lens 112 and the pad opening is short, non-uniformity (the unevenness in the formation) occurs in the color filter 110 and the micro-lens 112. As a result, because the transmissivity and the conversion gain vary among the pixels, the image characteristics are influenced thereby.

Further, the solid-state imaging device 10 is easily influenced in the chip edge thereof by thermal stress caused by the difference in linear expansion coefficients among Si, the adhesive agent, and the tab during a die bonding process and by stress related to cure shrinkage of the resin during a molding process, and image characteristics are influenced thereby (e.g., Δidsat=5% per stress of 100 Mpa).

Further, when the solid-state imaging device 10 is configured so that the pixels include an analog memory or a second amplifying transistor (SF2), because an increase in the pixel size leads to an increase in the distance between photo diodes (PDs), the resolution becomes degraded. In other words, there is no freedom in choosing the size of the circuit.

First Embodiment

Figure 4:
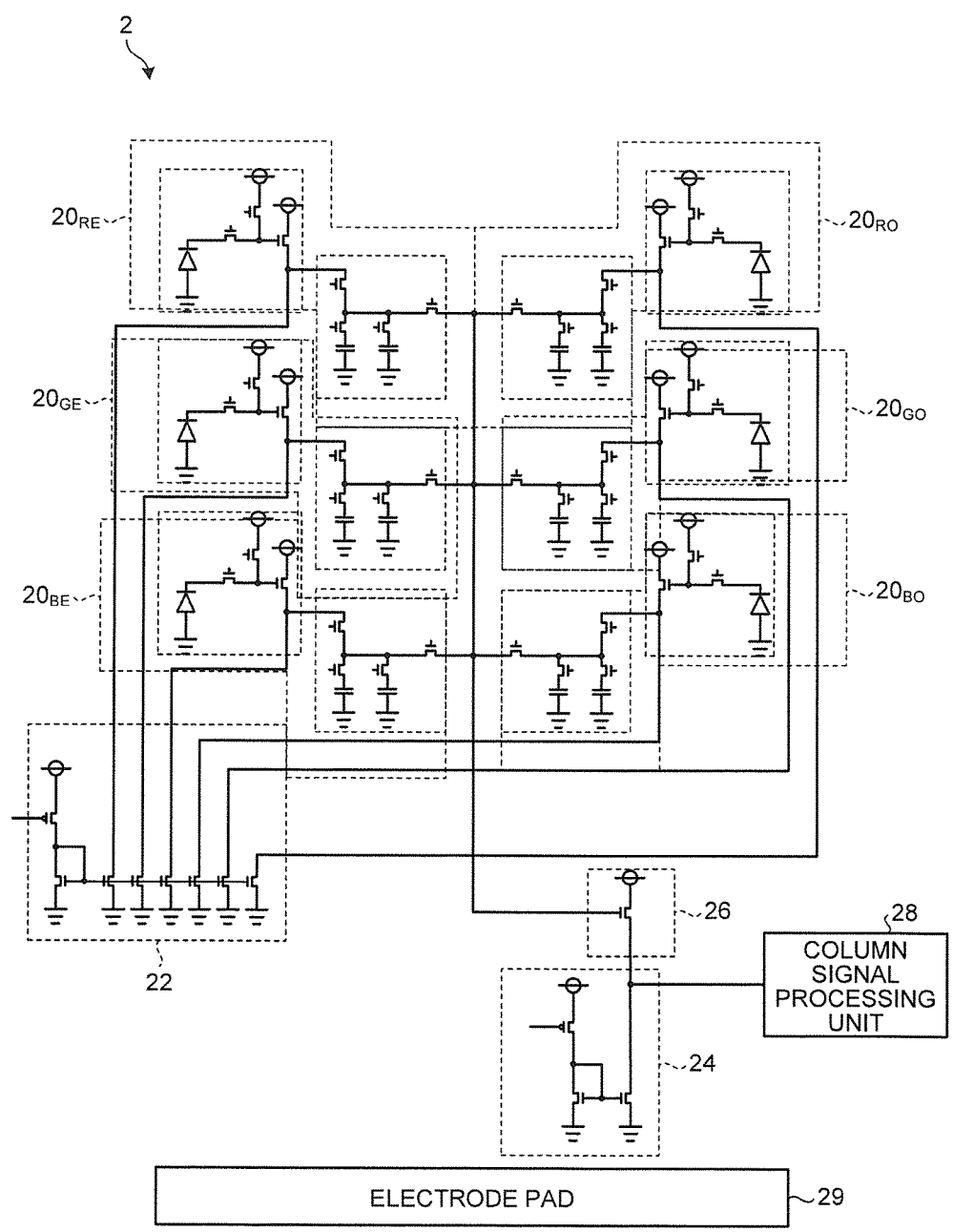
FIG. 4 is a diagram illustrating an exemplary configuration of a solid-state imaging device according to a first embodiment.

Next, a configuration of a solid-state imaging device according to a first embodiment will be explained, with reference to FIGS. 4 and 5. FIG. 4 is a diagram illustrating an exemplary configuration of a solid-state imaging device 2 according to the first embodiment.

The solid-state imaging device 2 may be, for example, a CMOS color linear sensor and may be installed in an image reading device or a Multifunction Peripheral (MFP) including an image reading device. The solid-state imaging device 2 includes a red (R) light reading unit $20_{RE}$, another red (R) light reading unit $20_{RO}$, a green (G) light reading unit $20_{GE}$, another green (G) light reading unit $20_{GO}$, a blue (B) light reading unit $20_{BE}$, and another blue (B) light reading unit $20_{BO}$. The R light reading unit $20_{RE}$ includes a pixel 30 as described below with reference to FIG. 5 and is provided with a color filter that transmits red-colored light and an on-chip micro-lens. The R light reading unit $20_{RO}$ has the same configuration as that of the R light reading unit $20_{RE}$.

Further, the G light reading unit $20_{GE}$, the G light reading unit $20_{GO}$, the B light reading unit $20_{BE}$, and the B light reading unit $20_{BO}$ each also have the same configuration as that of the R light reading unit $20_{RE}$, except that the color filter therein that determines the color of the light received thereby is different. Further, the R light reading unit $20_{RE}$, the R light reading unit $20_{RO}$, the G light reading unit $20_{GE}$, the G light reading unit $20_{GO}$, the B light reading unit $20_{BE}$, and the B light reading unit $20_{BO}$ include six pixels and structure one column that sequentially outputs the signals therefrom through a single system.

Although FIG. 4 illustrates the part structuring the one column, the solid-state imaging device 2 is configured in such a manner that a plurality of columns are arranged along one direction so that, for example, 7,000 or more pixels 30 are arranged along one direction for each of the colors of the received light. Further, the quantity of pixels 30 included in each of the columns in the solid-state imaging device 2 is not limited to six and may be any number. Further, the solid-state imaging device 2 may include a controlling unit that controls the constituent elements thereof.

Figure 5:
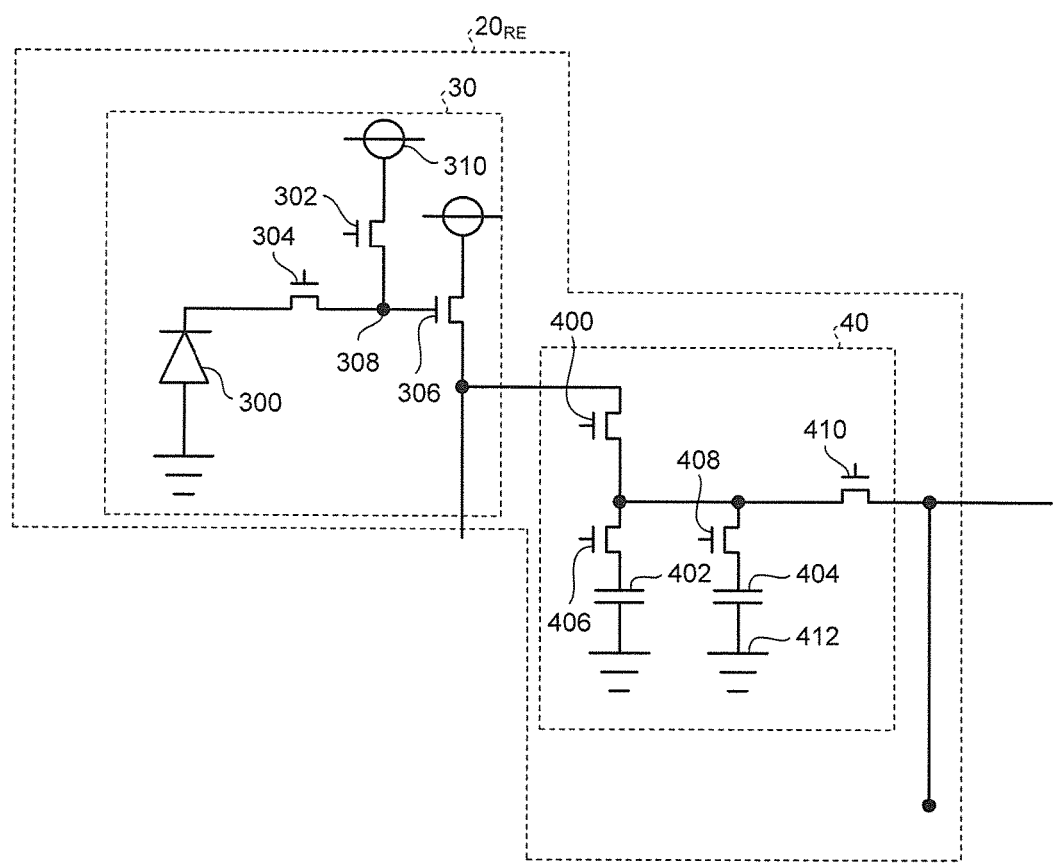
FIG. 5 is a diagram illustrating an exemplary configuration of a red (R) light reading unit included in the solid-state imaging device.

FIG. 5 is a diagram illustrating an exemplary configuration of the R light reading unit $20_{RE}$ included in the solid-state imaging device 2. The R light reading unit $20_{RE}$ includes the pixel 30 and an analog memory unit 40 and is configured to receive R light and to perform a photoelectric conversion.

The pixel 30 has formed therein a light receiving element (a photo diode [PD]) 300, a reset transistor (RT) 302, a transfer transistor (TX) 304, a first amplifying transistor (SF1: a first amplifier) 306, a floating diffusion region (FD region) 308. A reset (drain) voltage (Vrd) 310 is applied to the reset transistor 302.

As for the light receiving element 300, the anode thereof is connected to a ground voltage, whereas the cathode thereof is connected to the transfer transistor 304, so as to generate an electric charge corresponding to the amount of received light. Further, the color of the light received by each of the light receiving elements 300 is determined by a color filter provided on the upper layer side thereof. A micro-lens is provided over each of the color filters. The other end of the transfer transistor 304 is connected to the reset transistor 302 and the first amplifying transistor 306, so that the electric charge generated by the light receiving element 300 is transferred to the FD region 308.

The FD region 308 is a region in which the transfer transistor 304, the first amplifying transistor 306, and the reset transistor 302 are connected together and functions as a charge-voltage converter that converts an electric charge into a voltage. The reset transistor 302 is configured to reset the electric charge in the FD region 308. The first amplifying transistor 306 is a MOS transistor and functions as a source follower that amplifies the voltage at the FD region 308 and outputs the amplified voltage to the subsequent stage. Further, when the size of the first amplifying transistor 306 is too large, the capacitance imposed on the FD region 308 becomes large, which lowers the charge-voltage conversion gain (because V=Q/C). Thus, the first amplifying transistor 306 is arranged to be smaller in size than the second amplifying transistor 26 (explained later).

The analog memory unit 40 includes a selecting switch (SL) 400, a memory capacitor (Cr) 402, a memory capacitor (Cs) 404, a selecting switch (RDR) 406, a selecting switch (RDS) 408, and a selecting switch (SW) 410. A potential (a memory reference voltage 412: Vm) that is different from the ground voltage of other circuits is applied to one end of the memory capacitor 402 and one end of the memory capacitor 404.

The memory capacitor 402 may be, for example, a MOS capacitor and is configured to store therein an electric charge when the pixel 30 is reset. The memory capacitor 404 may be, for example, a MOS capacitor and is configured to store therein an electric charge indicating a pixel signal read by the pixel 30. Further, as for the memory capacitor 402 and the memory capacitor 404, because the voltage applied to the selecting switch side is at a level closer to the power source voltage side than the ground-side voltage, it is desirable to configure the memory capacitor 402 and the memory capacitor 404 each with an nch-type MOS transistor (MOS capacitor).

Further, as for the memory capacitor 402 and the memory capacitor 404, because the potential difference between the two ends of the MOS capacitor may not necessarily be large enough to maintain the oxide film capacitance, it is desirable to configure the memory capacitor 402 and the memory capacitor 404 each with a depression-type MOS capacitor. Further, as for the memory capacitor 402 and the memory capacitor 404, the memory reference voltage 412 at the one end may be common to the ground voltages in other circuits; however, when the memory reference voltage 412 fluctuates, the fluctuation may directly be reflected in the output depending on the timing. Consequently, the memory capacitor 402 and the memory capacitor 402 are configured so that the memory reference voltage 412 and the ground voltages for the other circuits are separate.

The selecting switch 400, the selecting switch 406, the selecting switch 408, and the selecting switch 410 operate when the electric charge is stored in either the memory capacitor 402 or the memory capacitor 404 or when either the memory capacitor 402 or the memory capacitor 404 transfers the stored electric charge (the voltage). More specifically, via the selecting switch 400, the first amplifying transistor 306 is connected to the selecting switches 406 and 408 for selecting one of the memory capacitor 402 and the memory capacitor 404 and to the selecting switch 410 for selecting one of the pixels 30. The memory capacitor 402 and the memory capacitor 404 structure an electric charge storage unit that stores therein an electric charge, so that when the CDS is performed as described above, a voltage (a signal) is read therefrom.

Further, the solid-state imaging device 2 (FIG. 4) includes a first current source 22, a second current source 24, a second amplifying transistor (a second amplifier) 26, a column signal processing unit 28, and an electrode pad 29. The first current source 22 serves as a constant current source for the first amplifying transistors 306 of the pixels 30 in the column. The second current source 24 serves as a constant current source for the second amplifying transistor 26 provided in correspondence with the column. The currents flowing through the first current source 22 and the second current source 24 are arranged to be variable.

The second amplifying transistor 26 may be, for example, an nch-type MOS transistor. The second amplifying transistor 26 is configured to amplify the signal (the voltage) output by any of the pixels 30 in the column and outputs the amplified signal to the column signal processing unit 28. Because the second amplifying transistor 26, even when being large in size, does not influence the conversion gain as much as the first amplifying transistor 306 does, the second amplifying transistor 26 is arranged to be larger in size than the first amplifying transistor 306 in order to improve noise characteristics (flicker noise, thermal noise, random telegraph signal [RTS] noise, and the like). In consideration of the back-gate effect, it is desirable to connect the back gate of the second amplifying transistor 26 to a source. Alternatively, the second amplifying transistor 26 may be a pch-type MOS transistor.

The column signal processing unit 28 is configured to perform a predetermined processing process on the signal output by any of the pixels 30 in the column. For example, the column signal processing unit 28 is a signal processing unit that performs a process such as a CDS process on the signal output by any of the pixels 30 in the column. Further, the column signal processing unit 28 may include an Analog/Digital (A/D) converter or the like. The electrode pad 29 corresponds to the electrode pad 14 described above and has a power source terminal, an output terminal, and the like provided thereon.

The selecting switches described above (e.g., the selecting switch 410), the first amplifying transistor 306, and the second amplifying transistor 26 are each configured with a MOS transistor. Further, although having been described as each being configured with a single transistor, the selecting switches and the like may each be configured with a CMOS-SW employing a nch-type Tr and a pch-type Tr, depending on the ON-resistance or the charge injection of the transistors. Further, the selecting switches and the like each may be configured with a pch-type Tr, depending on the potential. For example, when the reset voltage Vrd is high, because the potential of the selecting switch 400 is also high, the ON-resistance becomes lower when the switch is of the pch-type than when the switch is of the nch-type.

Figure 6:
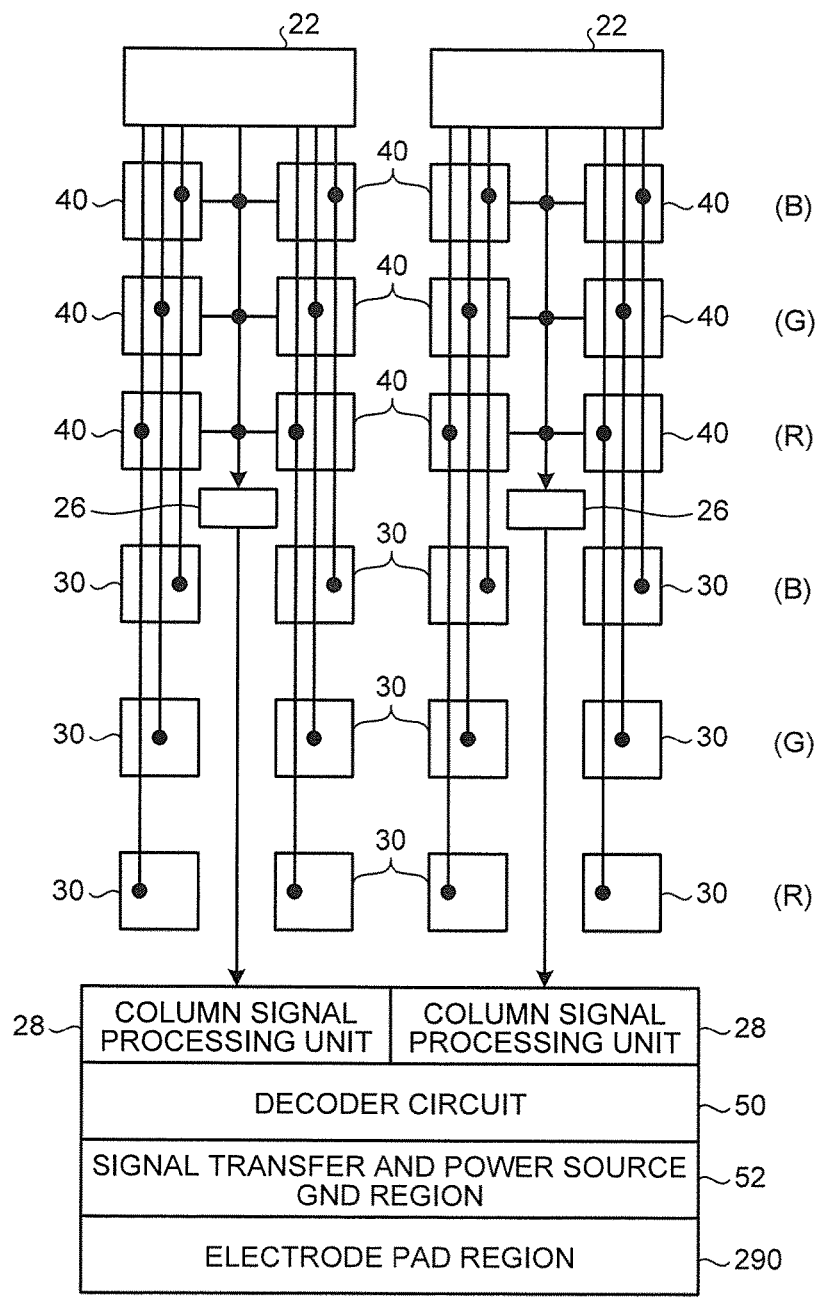
FIG. 6 is a schematic diagram of a first example of a layout of the solid-state imaging device.

Next, an exemplary layout on the chip of the solid-state imaging device 2 will be explained. FIG. 6 is a schematic diagram of a first example of the layout on the chip of the solid-state imaging device 2. In FIG. 6, (R), (G), and (B) each indicate that a color filter transmitting light in the colors of red (R), green (G), and blue (B) is provided, respectively.

As illustrated in FIG. 6, in the solid-state imaging device 2, for example, the region where the analog memory units 40 each corresponding to a pixel 30 are formed is positioned adjacent (on the upper side in FIG. 6) to the region where the pixels 30 arranged in correspondence with the colors are formed. In this situation, the region where the pixels 30 are formed serves as a photoelectric converter including the plurality of light receiving elements 300 that are arranged along one direction in correspondence with the colors of the received light and that each generate an electric charge corresponding to the amount of received light. Further, the region where the analog memory units 40 are formed serves as an electric charge storage unit including the memory capacitors 402 and the memory capacitors 404 configured to store therein the electric charges generated by the plurality of light receiving elements 300. In this situation, the second current source 24 may also be provided in the region where the first current source 22 is provided.

A decoder circuit 50 is configured to decode the signal output from any of the pixels 30 in the two columns, for example. A signal transfer and power source GND region 52 has provided therein wirings for transferring signals and grounding the power source. The electrode pad region 290 is a region where the electrode pads 29 corresponding to the two columns, for example, are provided. In FIG. 6, the one decoder circuit 50, the one signal transfer and power source GND region 52, and the one electrode pad region 290 are provided for the two columns; however, possible embodiments are not limited to this example.

The distance between each of the pixels 30 and the analog memory unit 40 corresponding to the pixel 30 is arranged to be substantially the same throughout the solid-state imaging device 2. Because the solid-state imaging device 2 is configured in such a manner that, even if the colors of the received light are different from one another, the distance between each of the pixels 30 and the corresponding analog memory unit 40 is arranged to be substantially the same, the wiring resistances are substantially the same, and it is therefore possible to prevent image characteristics from being influenced by differences in the settling period of time or the like. Further, the analog memory units 40 are connected to both the first current sources 22 and the second amplifying transistors 26. Accordingly, in the first example of the layout on the chip of the solid-state imaging device 2, the region where the first current sources 22 are provided, the region where the analog memory units 40 are provided, and the region where the second amplifying transistors 26 are provided are arranged in the stated order.

Figure 7:
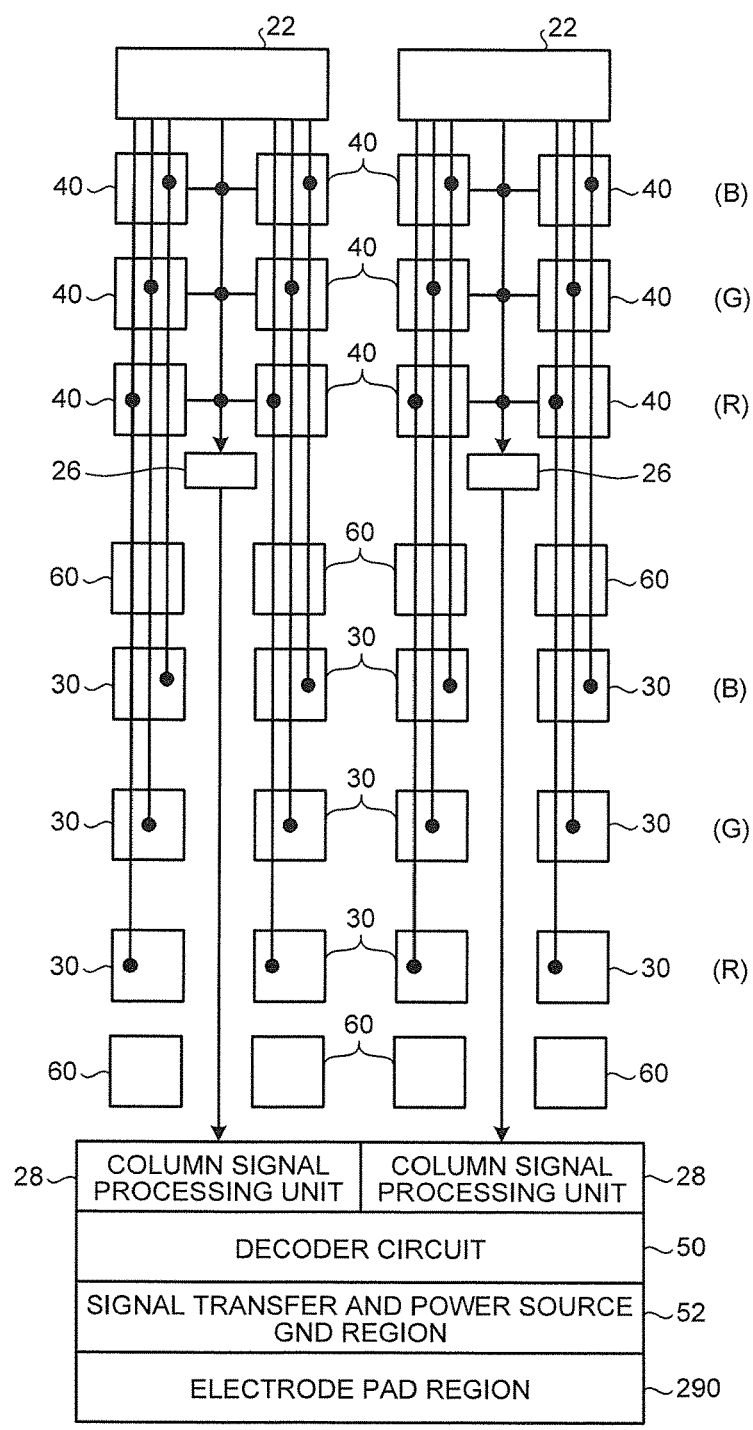
FIG. 7 is a schematic diagram of a second example of the layout of the solid-state imaging device.

FIG. 7 is a schematic diagram of a second example of the layout on the chip of the solid-state imaging device 2. The second example of the layout on the chip of the solid-state imaging device 2 is obtained by adding a plurality of dummy pixels 60 to the first example illustrated in FIG. 6. As illustrated in FIG. 7, the dummy pixels 60 are pixels that are not connected to the analog memory units 40 and are positioned so as to sandwich the region where the pixels 30 are provided. In other words, some of the plurality of dummy pixels 60 are arranged between the region where the second amplifying transistors 26 are provided and the region where the pixels 30 are provided. Further, some other dummy pixels 60 are provided between the region where the pixels 30 are provided and the region where the column signal processing units 28 are provided.

Each of the dummy pixels 60 may be configured to include only a PD (as well as a color filter and a micro-lens); however, it is desirable to configure each of the dummy pixels 60 to include all the dummy elements such as the first amplifying transistor 306, for the purpose of reducing impacts of disturbance (crosstalk) and improving the finished state of the elements.

Figure 8:
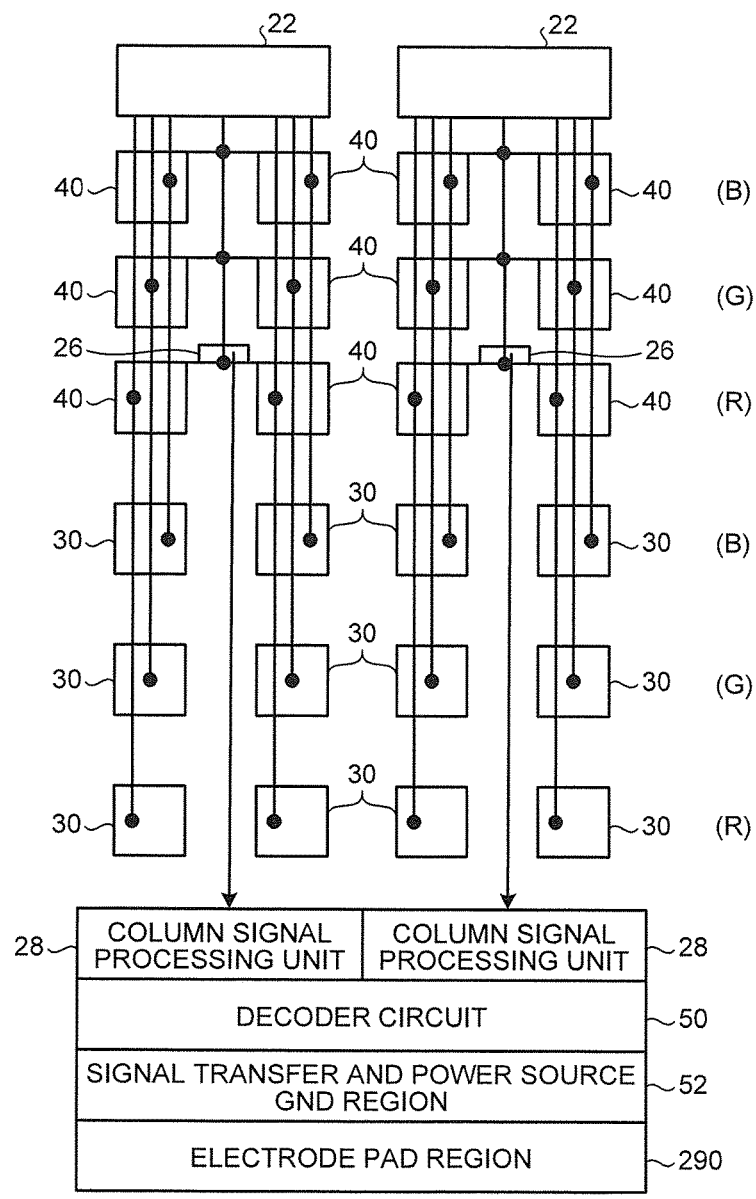
FIG. 8 is a schematic diagram of a third example of the layout of the solid-state imaging device.

FIG. 8 is a schematic diagram of a third example of the layout on the chip of the solid-state imaging device 2. The third example of the layout on the chip of the solid-state imaging device 2 is obtained by changing the positions of the second amplifying transistors 26 in the first example illustrated in FIG. 6. More specifically, in the third example of the layout on the chip of the solid-state imaging device 2, the distances from any of the analog memory units 40 to the second amplifying transistor 26 are arranged to be as equal as possible (substantially equal), in each of the columns. Further, the dummy pixels 60 may also be provided.

Figure 9:
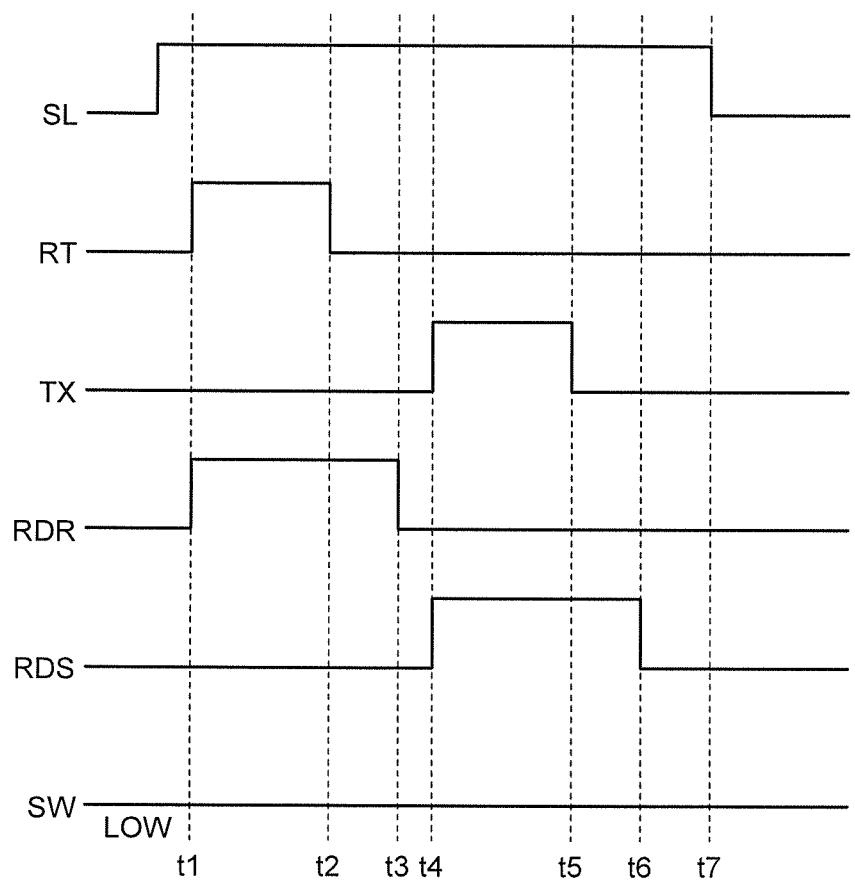
FIG. 9 is a timing chart indicating writing timing.

Next, an operation of the solid-state imaging device 2 will be explained. FIG. 9 is a timing chart indicating writing timing to the analog memory unit 40 in the solid-state imaging device 2. As illustrated in FIG. 9, in the solid-state imaging device 2, the reset transistor (RT) 302 connected to the reset voltage Vrd is turned on at a time t1 so that the FD region 308 is initialized. After that, in the solid-state imaging device 2, writing to the memory capacitor 402 on a reset level is started via the first amplifying transistor 306, the selecting switch 400, and the selecting switch 406.

In the solid-state imaging device 2, after the reset transistor 302 is turned off at a time t2, the writing to the memory capacitor 402 is ended at a time t3. In other words, in the solid-state imaging device 2, the reset level is stored into the memory capacitor 402.

In the solid-state imaging device 2, as a result of the transfer transistor 304 being turned on at a time t4, the electric charge generated by the light receiving element 300 by receiving light is transferred to the first amplifying transistor 306. After that, in the solid-state imaging device 2, the selecting switch 408 is turned on so that writing to the memory capacitor 404 is performed. In this situation, the writing is performed by converting the electric charge generated by the light receiving element 300 as a result of receiving the light, into a voltage by the FD region 308. Consequently, the data held in the memory capacitor 404 is a signal level indicating the read image. Further, in the solid-state imaging device 2, the writing to the analog memory unit 40 is ended at a time t6, so that the storing of the signal level into the memory capacitor 404 is completed.

Figure 10:
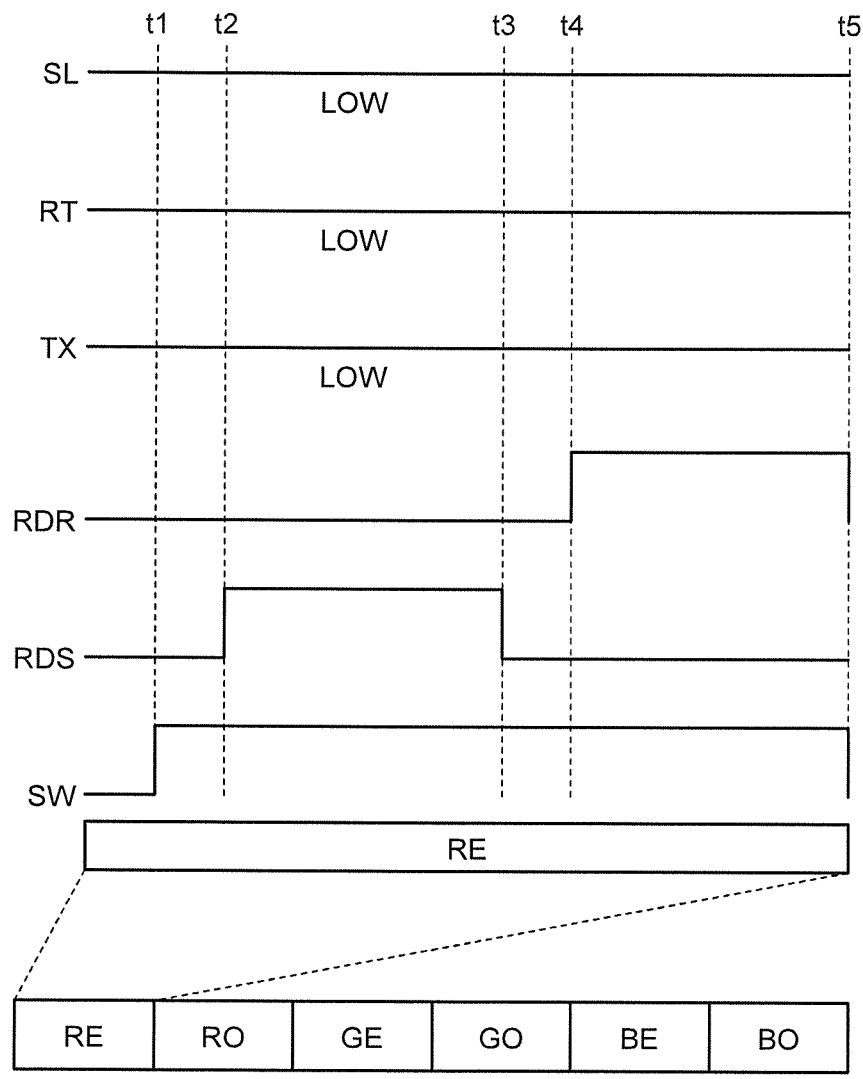
FIG. 10 is a timing chart indicating reading timing.

FIG. 10 is a timing chart indicating reading timing from the analog memory unit 40 in the solid-state imaging device 2. In the present example, FIG. 10 illustrates an operation of the solid-state imaging device 2 including six pixels 30 and six analog memory units 40 in one column. The solid-state imaging device 2 is configured so that data is sequentially read from the R light reading unit $20_{RE}$, the R light reading unit $20_{RO}$, the G light reading unit $20_{GE}$, the G light reading unit $20_{GO}$, the B light reading unit $20_{BE}$, and the B light reading unit $20_{BO}$ (RE, RO, GE, GO, BE, and BO). In the following sections, an operation of the R light reading unit $20_{RE}$ will be explained as an example.

In the solid-state imaging device 2, the selecting switch 410 to select one from among RE, RO, GE, GO, BE, and BO is turned on at a time t1. After that, in the solid-state imaging device 2, the signal level stored in the memory capacitor 404 of the R light reading unit $20_{RE}$ is read at a time t2 and is output to the column signal processing unit 28 on the subsequent stage via the second amplifying transistor 26. In the solid-state imaging device 2, the reading from the memory capacitor 404 performed by the R light reading unit $20_{RE}$ is ended at a time t3.

Subsequently, in the solid-state imaging device 2, the electric charge (the reset level) stored in the memory capacitor 402 is read at a time t4 and is output to the column signal processing unit 28 on the subsequent stage via the second amplifying transistor 26. In the solid-state imaging device 2, the reading is ended at a time t5.

The column signal processing unit 28 performs the process (CDS) of calculating a substantial signal level by calculating the difference between the signal level and the reset level. When the offset levels vary among the pixels, if there is variance among the first amplifying transistors 306, for example, the image exhibits a vertical stripe (fixed pattern noise). By performing the CDS process, the solid-state imaging device 2 cancels the offset level of each of the pixels 30. Further, kTC noise that occurs when the reset transistor 302 is turned on is correlated with the reset level and the signal level. For this reason, it is also acceptable to configure the solid-state imaging device 2 so as to cancel the occurrences of the noise by performing the CDS process.

In this situation, the column signal processing unit 28 performs the following process, for example: The column signal processing unit 28 holds a signal level $V_s$ by having the signal level $V_s$ clamped to a certain reference voltage $V_{ref}$. The column signal processing unit 28 converts the held signal level $V_s$ into a digital signal by employing an A/D converter. Subsequently, the column signal processing unit 28 accepts a reset level $V_r$. After that, the column signal processing unit 28 multiplies the difference between the signal level $V_s$ and the reset level $V_r$ by the gain (by A) and outputs a result of subtracting the multiplication result from the clamp level $V_{ref}$. In other words, the result from $V_{ref} - (V_r - V_s) \times A$ is output and converted into a digital signal. The column signal processing unit 28 extracts the difference between the reset level $V_r$ and the signal level $V_s$ by converting the $V_{ref}$ level and the $V_{ref}-(V_r-V_s)\times A$ level each into a digital signal and calculating the difference therebetween.

As explained above, the solid-state imaging device 2 is configured so that the memory capacitor 404 and the like occupying a relatively large area are positioned so as to oppose the column signal processing units 28 across the pixels 30. It is therefore possible to prevent the occurrence of unevenness in the application of the color filter pigments and unevenness in the formation of the micro-lenses. Further, in the solid-state imaging device 2, because the distance from the chip edge to each of the pixels 30 is arranged to be long, the stress is less likely to be applied thereto. Further, the solid-state imaging device 2 is configured so that the region where the pixels 30 are provided and the region where the analog memory units 40 are provided are separated from each other, the degree of freedom in designing the circuit sizes of the analog memory units 40, the column signal processing units 28, and the like is enhanced. In addition, the number of signal lines extending across the pixels 30 is reduced, because each of the second amplifying transistors 26 is configured so as to amplify the outputs of a plurality of pixels 30.

Second Embodiment

Figure 11:
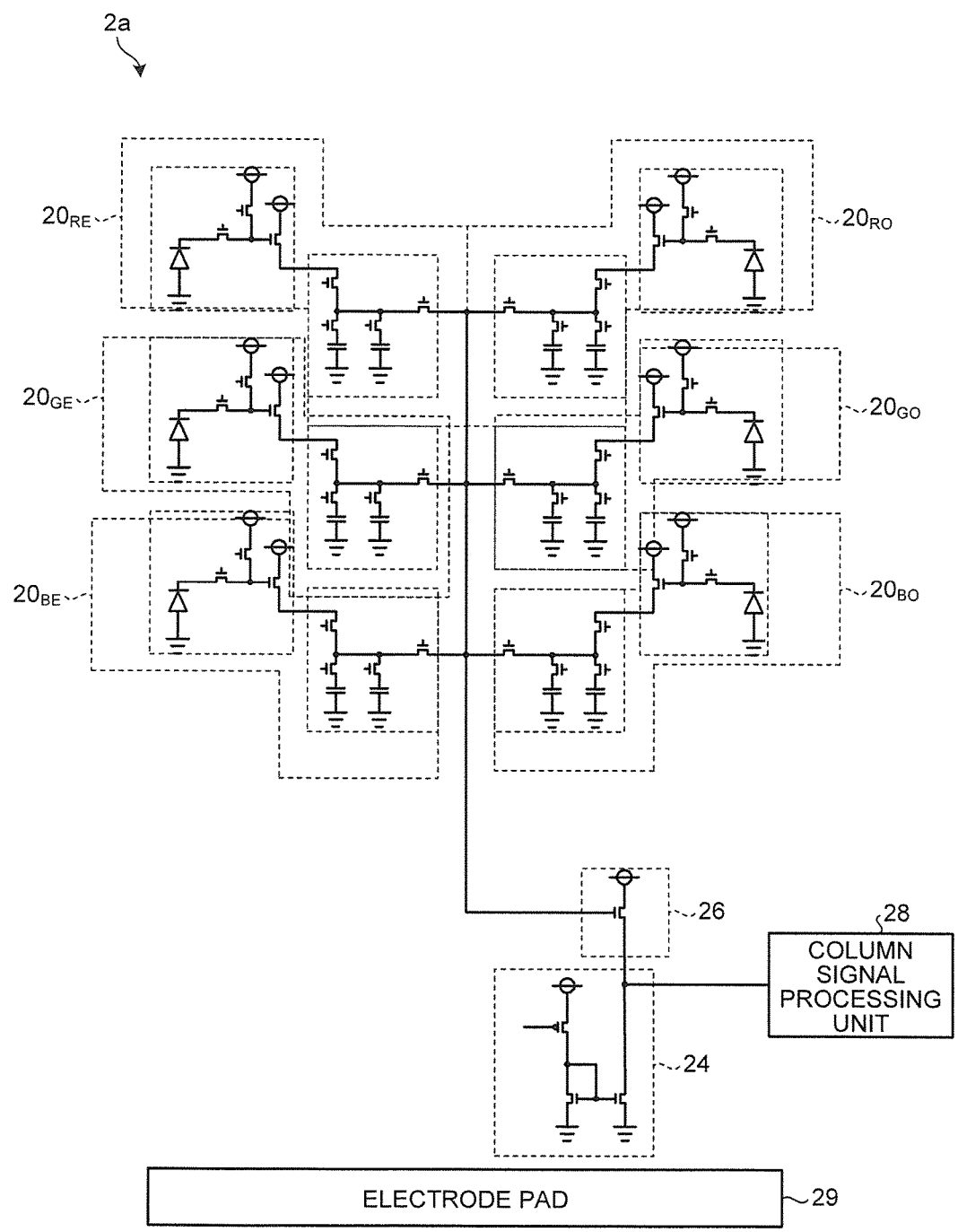
FIG. 11 is a diagram illustrating an exemplary configuration of a solid-state imaging device according to a second embodiment.

Next, a configuration of a solid-state imaging device according to a second embodiment will be explained, with reference to FIG. 11. FIG. 11 is a diagram illustrating an exemplary configuration of a solid-state imaging device 2a according to the second embodiment. The solid-state imaging device 2a is obtained by removing the first current source 22 from the solid-state imaging device 2 illustrated in FIG. 4. Because the solid-state imaging device 2a is not provided with the first current source 22, the direct current caused to flow by the first current source 22 is reduced. In other words, the solid-state imaging device 2a is configured to perform a subthreshold writing process.

According to at least one aspect of the present invention, an advantageous effect is achieved where it is possible to provide a solid-state imaging device capable of preventing the image reading characteristics from being degraded.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited to the embodiments and thus may be preferably set. It is therefore to be understood that within the scope of the appended claims, the disclosure of the present invention may be practiced otherwise than as specifically described herein.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA) and conventional circuit components arranged to perform the recited functions.

What is claimed is:

1. A solid-state imaging device comprising:
a photoelectric converter including a pair of first light-receiving elements for a first color, a pair of second light-receiving elements for a second color, and a pair of third light-receiving elements for a third color, the pair of first light-receiving elements being arranged along a first direction, the pair of second light-receiving elements being arranged along a second direction, the pair of third light-receiving elements being arranged along a third direction, the first, second and third directions being parallel to each other, and each light-receiving element generating electric charge corresponding to an amount of received light;
an electric charge storage unit including pairs of capacitors corresponding, on a one-to-one basis, to respective pairs of the light-receiving elements included in the photoelectric converter, and for each pair of the capacitors and each respective pair of the light-receiving elements, each capacitor storing the electric charge generated by a corresponding light-receiving element, the pairs of the capacitors being arranged in a direction perpendicular to each of the first, second and third directions; and
signal processing circuitry configured to process each of the electric charges stored by the pairs of the capacitors as a signal, wherein
the electric charge storage unit is disposed so as to oppose the signal processing circuitry across the photoelectric converter,
the photoelectric converter is disposed between the electric charge storage unit and the signal processing circuitry, and
the electric charge storage unit and the signal processing unit are electrically connected to each other by wiring passing between the two light-receiving elements of each pair of the light-receiving elements.

2. The solid-state imaging device according to claim 1, further comprising:
a plurality of first amplifiers amplifying voltages from a plurality of charge-voltage converters, respectively, the charge-voltage converters being configured to convert the electric charges generated by respective light-receiving elements into the voltages; and
a plurality of second amplifiers amplifying a voltage for a plurality of columns, respectively, each column being configured to sequentially output a signal through a single system from predetermined light-receiving elements from among the pairs of the light-receiving elements, wherein
each amplifier of the plurality of first amplifiers and the plurality of second amplifiers is configured by using a metal-oxide-semiconductor (MOS) transistor.

3. The solid-state imaging device according to claim 2, wherein each amplifier of the plurality of second amplifiers is larger in size than each amplifier of the plurality of first amplifiers.

4. The solid-state imaging device according to claim 2, wherein each amplifier of the plurality of first amplifiers is configured by using a single MOS transistor.

5. The solid-state imaging device according to claim 2, further comprising a switch configured to be turned on to store the electric charge, generated by a light-receiving element, in a corresponding capacitor, wherein
the switch passes a current flowing when a first amplifier of the plurality of first amplifiers amplifies a voltage.

6. The solid-state imaging device according to claim 2, wherein a second amplifier of the plurality of second amplifiers is disposed in each column so that respective distances between the disposed second amplifiers and corresponding capacitors are substantially equal.

7. The solid-state imaging device according to claim 2, further comprising a current source configured to supply current to the plurality of first amplifiers, wherein the photoelectric converter and the electric charge storage unit are disposed between the current source and the signal processing circuitry.

8. The solid-state imaging device according to claim 1, wherein each capacitor is a MOS capacitor.

9. The solid-state imaging device according to claim 8, wherein each capacitor is of a depression type.

10. The solid-state imaging device according to claim 1, wherein
each of the first, second, and third colors is determined by a color filter provided on an upper layer side of a corresponding light-receiving element, and
a micro-lens is provided over the color filter.

11. The solid-state imaging device according to claim 1, wherein a potential that is different from a ground voltage of any other circuit included in the solid-state imaging device is applied to one end of each capacitor.

12. The solid-state imaging device according to claim 1, further comprising plural dummy light-receiving elements, wherein
the pairs of the light-receiving elements are disposed between at least two of the plural dummy light receiving elements.

13. The solid-state imaging device according to claim 1, wherein the solid-state imaging device is configured with the pairs of capacitors of the electric charge storage unit opposing the signal processing circuitry across the photoelectric converter.

14. The solid-state imaging device according to claim 1, wherein the signal processing circuitry is disposed between the photoelectric converter and one or more electrode pads.

15. The solid-state imaging device according to claim 1, further comprising an amplifier configured to amplify a signal which (a) is output by a capacitor, among the pairs of the capacitors in the electric charge storage unit, and (b) corresponds to the electric charge stored by the capacitor, among the pairs of the capacitors in the electric charge storage unit, the amplifier being coupled to the signal processing circuitry via the wiring passing between the two light-receiving elements of each pair of the light-receiving elements.

16. A solid-state imaging device comprising:
a photoelectric converter including a pair of first light-receiving elements for a first color, a pair of second light-receiving elements for a second color, and a pair of third light-receiving elements for a third color, the pair of first light-receiving elements being arranged along a first direction, the pair of second light-receiving elements being arranged along a second direction, the pair of third light-receiving elements being arranged along a third direction, the first, second and third directions being parallel to each other, and each light-receiving element generating electric charge corresponding to an amount of received light;
an electric charge storage unit including pairs of capacitors corresponding, on a one-to-one basis, to respective pairs of the light-receiving elements included in the photoelectric converter, and for each pair of the capacitors and each respective pair of the light-receiving elements, each capacitor storing the electric charge generated by a corresponding light-receiving element, the pairs of the capacitors being arranged in a direction perpendicular to each of the first, second and third directions; and
signal processing circuitry configured to process each of the electric charges stored by the pairs of the capacitors as a signal, wherein
the photoelectric converter is disposed between the electric charge storage unit and the signal processing circuitry,
the signal processing circuitry is disposed between the photoelectric converter and one or more electrode pads, and
the electric charge storage unit and the signal processing circuitry are electrically connected to each other by wiring passing between the two light-receiving elements of each pair of the light-receiving elements.

17. A solid-state imaging device comprising:
a photoelectric converter including pairs of light-receiving elements, each pair of light-receiving elements generating electric charge corresponding to an amount of received light for a corresponding color of received light;
pairs of electric charge storage units connected to respective pairs of the light-receiving elements, on a one-to-one basis, and for each pair of the electric charge storage units and each respective pair of the light-receiving elements, each electric charge storage unit being configured to store the electric charge generated by a corresponding light-receiving element, each of the electric charge storage units having a capacitor; and
signal processing circuitry configured to process each of the electric charges stored by the pairs of the electric charge storage units as a signal,
the electric charge storage units are disposed so as to oppose the signal processing circuitry across the photoelectric converter, and
the electric charge storage units and the signal processing circuitry are electrically connected to each other by wiring passing between the two light-receiving elements of each pair of the light-receiving elements.

18. The solid-state imaging device according to claim 17, wherein the photoelectric converter includes, for each color of received light, a pair of the light-receiving elements arranged along one direction, the one direction being different from a direction in which the pairs of the electric charge storage units are arranged.

\* \* \* \* \*

UNITED STATES PATENT AND TRADEMARK OFFICE
CERTIFICATE OF CORRECTION

PATENT NO. : 10,446,595 B2
APPLICATION NO. : 15/158780
DATED : October 15, 2019
INVENTOR(S) : Yuuya Miyoshi et al.

Page 1 of 1

It is certified that error appears in the above-identified patent and that said Letters Patent is hereby corrected as shown below:

In the Claims

Claim 1, Column 10, Line 36, change "unit" to --circuitry--.

Signed and Sealed this
Twelfth Day of November, 2019

Andrei Iancu
*Director of the United States Patent and Trademark Office*